(12) United States Patent
Forrest et al.

(10) Patent No.: US 10,770,670 B2
(45) Date of Patent: Sep. 8, 2020

(54) INVERTED ORGANIC PHOTOSENSITIVE DEVICES

(71) Applicant: The Regents of the University of Michigan, Ann Arbor, MI (US)

(72) Inventors: Stephen R. Forrest, Ann Arbor, MI (US); Rhonda F. Bailey-Salzman, San Ramon, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/332,062

(22) Filed: Oct. 24, 2016

(65) Prior Publication Data

US 2017/0040558 A1    Feb. 9, 2017

Related U.S. Application Data

(62) Division of application No. 12/605,958, filed on Oct. 26, 2009, now Pat. No. 9,515,275.
(Continued)

(51) Int. Cl.
*H01L 51/42* (2006.01)
*H01L 21/228* (2006.01)
(Continued)

(52) U.S. Cl.
CPC ........ *H01L 51/4246* (2013.01); *H01L 21/228* (2013.01); *H01L 21/2225* (2013.01); *H01L 27/302* (2013.01); *H01L 51/0072* (2013.01); *H01L 51/0078* (2013.01); *H01L 51/441* (2013.01); *H01L 51/442* (2013.01); *H01L 51/0053* (2013.01); *H01L 51/424* (2013.01); *Y02E 10/549* (2013.01)

(58) Field of Classification Search
None
See application file for complete search history.

(56) References Cited

U.S. PATENT DOCUMENTS 5,595,934 A * 1/1997 Kim ........................ H01L 24/03
257/E23.02
5,600,131 A    2/1997 Miura
(Continued)

FOREIGN PATENT DOCUMENTS

| CN | 1645641 A | 7/2005 |
|---|---|---|
| CN | 1790766 A | 6/2006 |

(Continued)

OTHER PUBLICATIONS

Tong, X., et al., "Inverted Small Molecule Organic Photovoltaic Cells on Reflective Substrates," Applied Physics Letters, vol. 93, No. 17, pp. 173304-1 to 173304-3 (2008).
(Continued)

*Primary Examiner* — Long Pham
(74) *Attorney, Agent, or Firm* — Finnegan, Henderson, Farabow, Garrett & Dunner, LLP

(57) ABSTRACT

The present disclosure relates to organic photosensitive optoelectronic devices grown in an inverted manner. An inverted organic photosensitive optoelectronic device of the present disclosure comprises a reflective electrode, an organic donor-acceptor heterojunction over the reflective electrode, and a transparent electrode on top of the donor-acceptor heterojunction.

18 Claims, 18 Drawing Sheets

Related U.S. Application Data

(60) Provisional application No. 61/108,817, filed on Oct. 27, 2008, provisional application No. 61/109,305, filed on Oct. 29, 2008.

(51) Int. Cl.
*H01L 21/22* (2006.01)
*H01L 27/30* (2006.01)
*H01L 51/00* (2006.01)
*H01L 51/44* (2006.01)

(56) References Cited

U.S. PATENT DOCUMENTS

| | | |
|---|---|---|
| 6,297,495 B1 | 10/2001 | Bulovic et al. |
| 2004/0265630 A1 | 12/2004 | Suh et al. |
| 2005/0058009 A1 | 3/2005 | Yang et al. |
| 2005/0158451 A1* | 7/2005 | John ............... G01N 33/5438 427/2.11 |
| 2005/0227406 A1* | 10/2005 | Shtein ............... B82Y 30/00 438/99 |
| 2006/0060239 A1 | 3/2006 | Peumans et al. |
| 2006/0180810 A1 | 8/2006 | Lee et al. |
| 2006/0278944 A1 | 12/2006 | Rand et al. |
| 2007/0044836 A1 | 3/2007 | Forrest et al. |
| 2007/0215868 A1 | 9/2007 | Forrest et al. |
| 2009/0103310 A1 | 4/2009 | Chen |
| 2010/0206380 A1* | 8/2010 | Lindquist ............... B82Y 10/00 136/261 |
| 2011/0114921 A1 | 5/2011 | Yang et al. |

FOREIGN PATENT DOCUMENTS

| | | |
|---|---|---|
| CN | 1790768 A | 6/2006 |
| CN | 1832647 A | 9/2006 |
| CN | 101087013 A | 12/2007 |
| CN | 101215468 A | 7/2008 |
| JP | 2002-523904 A | 7/2002 |
| JP | 2003-515933 A | 5/2003 |
| JP | 2005-158775 A | 6/2005 |
| JP | 2007-525010 A | 8/2007 |
| JP | 2008-021958 A | 1/2008 |
| JP | 2008-522413 A | 6/2008 |
| JP | 2007-180462 A | 7/2012 |
| KR | 10-2007-0004959 A | 1/2007 |
| WO | WO 00/11725 | 3/2000 |
| WO | WO 01/39276 A1 | 5/2001 |
| WO | WO 2005/002745 A1 | 1/2005 |
| WO | WO 2005/101524 A2 | 10/2005 |
| WO | WO 2006/086040 A2 | 8/2006 |
| WO | WO 2006/138078 A1 | 12/2006 |
| WO | WO 2007/094361 A1 | 8/2007 |
| WO | WO 2010/051258 A1 | 5/2010 |

OTHER PUBLICATIONS

Kwong, C.Y., et al., "Improvement of the efficiency of phthalocyanine organic Schottky solar cells with ITO electrode treatment," Appl. Phys. A., vol. 77, pp. 555-560 (2003).

Rentenberger, S., et al., "UV/ozone treated Au for air-stable, low hole injection barrier electrodes in organic electronics", Journal of Applied Physics, vol. 100, No. 5, pp. 053701-1 to 053701-6 (2006).

* cited by examiner

INVERTED ORGANIC PHOTOSENSITIVE DEVICES

CROSS-REFERENCE TO RELATED APPLICATION

This application is a divisional of application Ser. No. 12/605,958, filed Oct. 26, 2009, which claims priority to U.S. Provisional Patent Application No. 61/108,817, entitled "Inverted Organic Photovoltaics," filed Oct. 27, 2008, and U.S. Provisional Patent Application No. 61/109,305, entitled "Inverted Organic Photovoltaics," filed Oct. 29, 2008. The entire contents of each of these applications are incorporated herein by reference.

STATEMENT REGARDING FEDERALLY SPONSORED RESEARCH

This invention was made with government support under DE-FG36-08GO18022 awarded by the Department of Energy and FA9550-07-1-0364 awarded by the Air Force Office of Scientific Research. The government has certain rights in the invention.

JOINT RESEARCH AGREEMENT

The subject matter of the present disclosure was made by, on behalf of, and/or in connection with one or more of the following parties to a joint university-corporation research agreement: Princeton University, The University of Michigan, and Global Photonic Energy Corporation. The agreement was in effect on and before the date the subject matter of the present disclosure was made, and such was made as a result of activities undertaken within the scope of the agreement.

FIELD

The present disclosure generally relates to organic photosensitive optoelectronic devices. More specifically, it is directed to organic photosensitive optoelectronic devices grown in an inverted manner, comprising a reflective substrate and transparent top electrode.

BACKGROUND

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting or heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction, as defined below, is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. Typically, a PV cell may provide power to a circuit, device or equipment, but may not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein, the term "semiconductor" denotes materials that can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic PV cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current ($J_{SC}$, in Amperes (2) the photovoltage under open circuit conditions, i.e., the open circuit voltage ($V_{OC}$), in Volts (V) and (3) the fill factor, FF.

PV devices produce a photo-generated current when they are connected across a load and are irradiated by light. When irradiated under infinite load, a PV device generates its maximum possible voltage, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu\Psi S_0^*$. Here $S_0$ and $S_0^*$ denote ground and excited molecular states, respectively. This energy absorption is associated with the promotion of an electron from a bound state in the Highest Occupied Molecular Orbital (HOMO) energy level, which may be a B-bond, to the Lowest Unoccupied Molecular Orbital (LUMO) energy level, which may be a B-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent, the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it may be desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a PV heterojunction. In traditional semiconductor theory, materials for forming PV heterojunctions have been denoted as generally being of either n or p type. Here, n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the HOMO energy level and LUMO energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first HOMO or LUMO energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction may also play an important role. The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D$~50 Å) than the optical absorption length (~500 Å), requiring a trade off between using a thick, and therefore resistive, cell with multiple or highly folded interfaces, or a thin cell with a low optical absorption efficiency.

Conventional organic PV cells are fabricated on transparent substrates such as glass or plastic coated with a transparent conductor, such as indium tin oxide (ITO). Because these substrates can be expensive and/or an important element of the overall cost structure of the device, the use of such transparent conducting substrates has the potential to limit the cost-effectiveness of the overall device, especially in large-area applications. Inverted organic PV cells utilize a reflective substrate and a transparent top contact. This architecture eliminates the need for comparatively high-cost transparent substrates and allows for fabrication on arbitrary surfaces. This design significantly extends the application of organic PV cells, such as allowing for power-generating coatings or growth on flexible and inexpensive opaque substrates, such as, for example, metal foil. Accordingly, there exists a need to develop more efficient inverted organic photosensitive structures.

SUMMARY

The present disclosure relates to organic photosensitive optoelectronic devices, such as organic PV devices, grown in an inverted manner. For purposes of this disclosure, growth in an inverted manner means starting with a reflective electrode and using a transparent top electrode. In some embodiments, the inverted organic PV devices described herein comprise:

a reflective electrode;

an organic donor-acceptor heterojunction over said reflective electrode; and a transparent electrode over said donor-acceptor heterojunction.

In some embodiments, the reflective electrode may comprise an substrate, such as a metal anode. In some embodiments, the electrode may comprise a low work function metal selected from steel, Ni, Ag, Al, Mg, In, and mixtures or alloys thereof.

In certain embodiments, the inverted organic PV devices described herein comprise: a surface-treated reflective electrode; an organic donor-acceptor heterojunction over said reflective electrode; and a transparent electrode over said donor-acceptor heterojunction.

In some embodiments, the donor of the organic donor-acceptor heterojunction may be selected from phthalocyanines, porphyrins, subphthalocyanines, and derivatives or transition metal complexes thereof. In some embodiments, the donor comprises copper phthalocyanine (CuPc). In some embodiments, the acceptor of the organic donor-acceptor heterojunction is chosen from polymeric or non-polymeric perylenes, polymeric or non-polymeric naphthalenes, and polymeric or non-polymeric fullerenes. In some embodiments, the acceptor comprises 3,4,9,10-perylenetetracarboxylic bis-benzimidazole (PTCBI).

In some embodiments, the transparent electrode is chosen from transparent oxides and metal or metal substitutes having a thickness sufficient to render them transparent or semi-transparent. In some embodiments, the transparent electrode is selected from transparent conducting oxides such as indium tin oxide (ITO), gallium indium tin oxide (GITO), and zinc indium tin oxide (ZITO).

In some embodiments, the inverted organic PV devices described herein may optionally comprise one or more blocking layers, such as an exciton blocking layer (EBL), between the reflective electrode and the transparent electrode. In some embodiments, the EBL may be selected from N,N'-diphenyl-N,N'-bis-alpha-naphthylbenzidine (NPD), aluminum tris (8-hydroxyquinoline) (Alq3), carbazole biphenyl (CBP), bathocuproine (BCP), and tris(acetylacetonato) ruthenium (III) (Ru(acac)$_3$).

Also described herein are power-generating devices comprising at least one organic PV device which comprises:

a reflective electrode;

an organic donor-acceptor heterojunction over said reflective electrode; and a transparent electrode over said donor-acceptor heterojunction.

In some embodiments, the power-generating devices are formed on a substrate film or a foil. In some embodiments, the power generating device is formed directly on the enclosure of a device, wherein the device enclosure functions as a substrate and the reflective electrode is formed over the substrate.

A method for producing an organic PV device is also described, comprising:
providing a reflective electrode;
performing at least one surface treatment on said reflective electrode;
forming an organic donor-acceptor heterojunction over said reflective electrode; and
forming a transparent electrode over said organic donor-acceptor heterojunction.

Also described are methods for generating and/or measuring electricity. In some embodiments, the method comprises:
providing light to an organic PV device comprising
a reflective electrode;
an organic donor-acceptor heterojunction over said reflective electrode; and
a transparent electrode over said donor-acceptor heterojunction.

In some embodiments the substrate is reflective, such as, for example, a metal foil, and the electrode closest to said reflective substrate is formed from suitable transparent or semitransparent materials defined herein.

BRIEF DESCRIPTION OF THE DRAWINGS

FIG. 3c is a plot of CuPc thickness versus $R_S$ and.

FIG. 5a also shows current-voltage curves for an inverted PV device consistent with the embodiments described herein: quartz/Ni (1000 Å)/CuPc (400 ↑)/PTCBI (100 Å)/BCP (100 Å)/ITO (400 Å) in the dark (filled triangles) and under simulated 1-sun illumination (open triangles). The lines are fit to the dark current curves.

DETAILED DESCRIPTION

Figure 1:
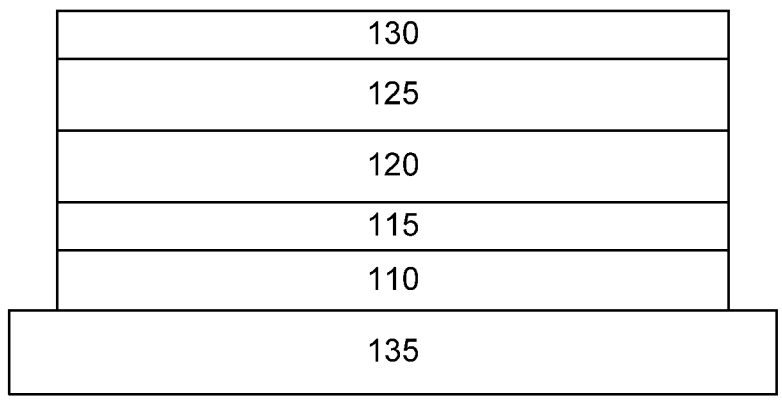
FIG. 1 shows an inverted organic PV device comprising a reflective electrode formed over a substrate, an organic donor-acceptor heterojunction on top of said reflective electrode, and a transparent electrode on top of said donor-acceptor heterojunction.
Figure 2A:
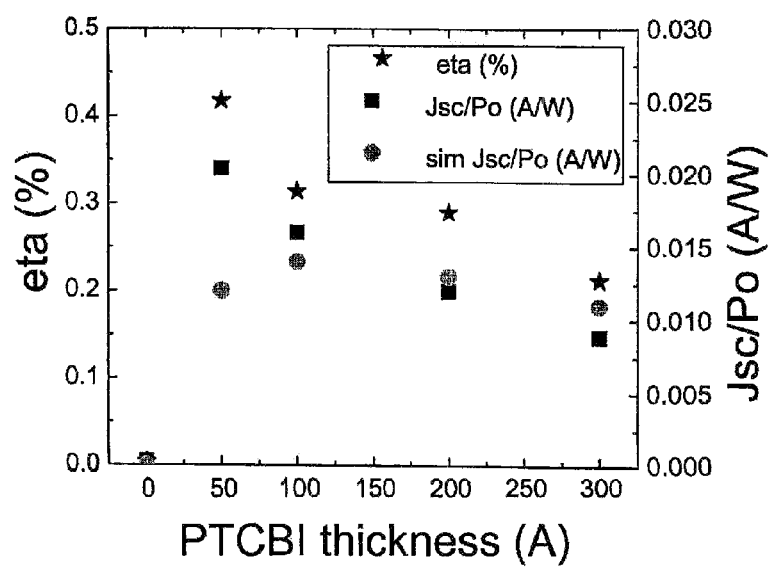
FIG. 2a is a plot of PTCBI thicknesses versus eta ($\eta_P$—power conversion efficiency) and responsivity ($J_{SC}/P_0$), wherein A/W connotes Amps per Watt and "sim" connotes "simulated."
Figure 2B:
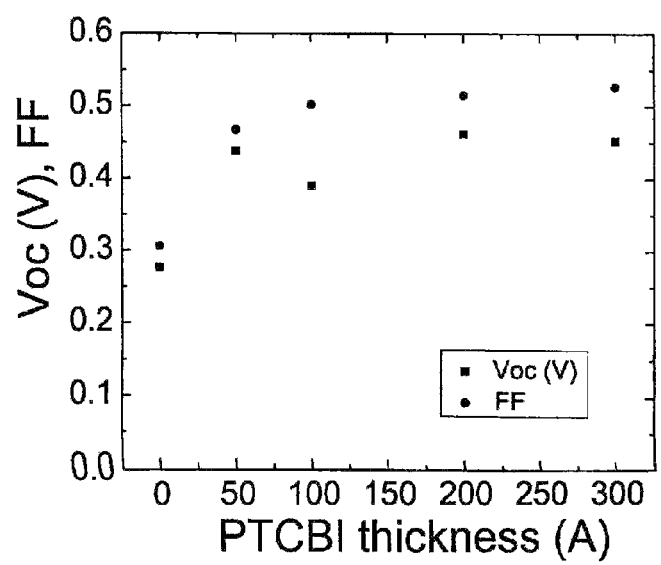
FIG. 2b is a plot of PTCBI versus $V_{OC}$ and FF.
Figure 2C:
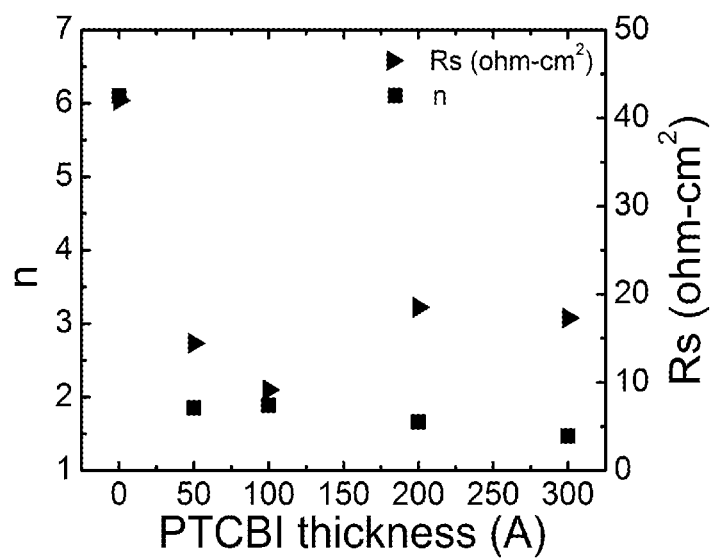
FIG. 2c is a plot of PTCBI thickness versus series resistance ($R_S$) and n.
Figure 2D:
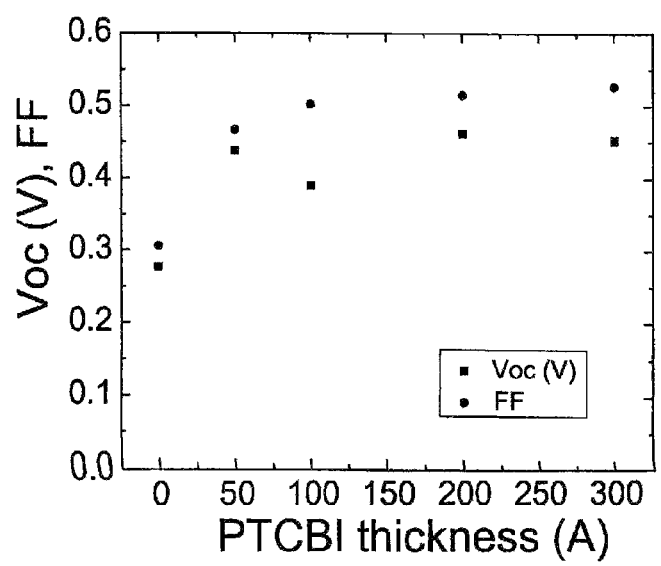
FIG. 2d is a plot of PTCBI thickness versus reverse saturation current ($J_S$).
Figure 3A:
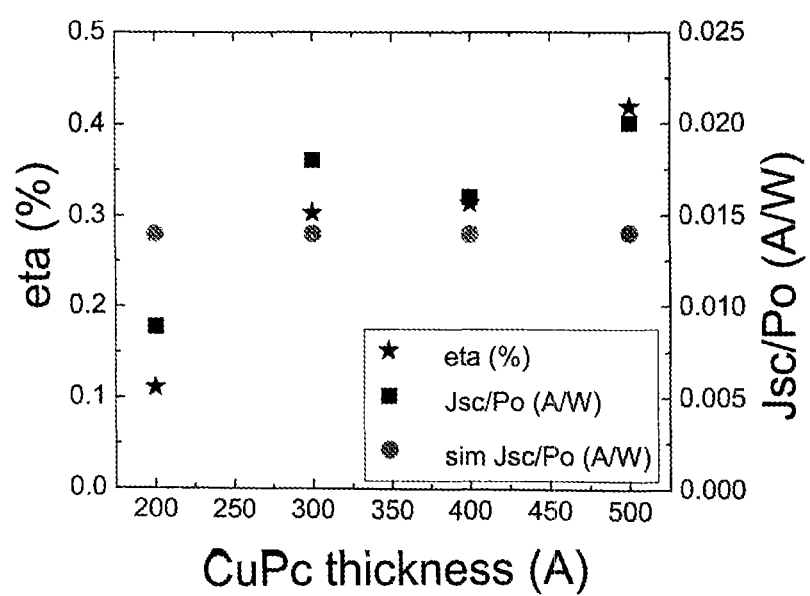
FIG. 3a is a plot of CuPc thicknesses versus eta and $J_{SC}/P_0$.
Figure 3B:
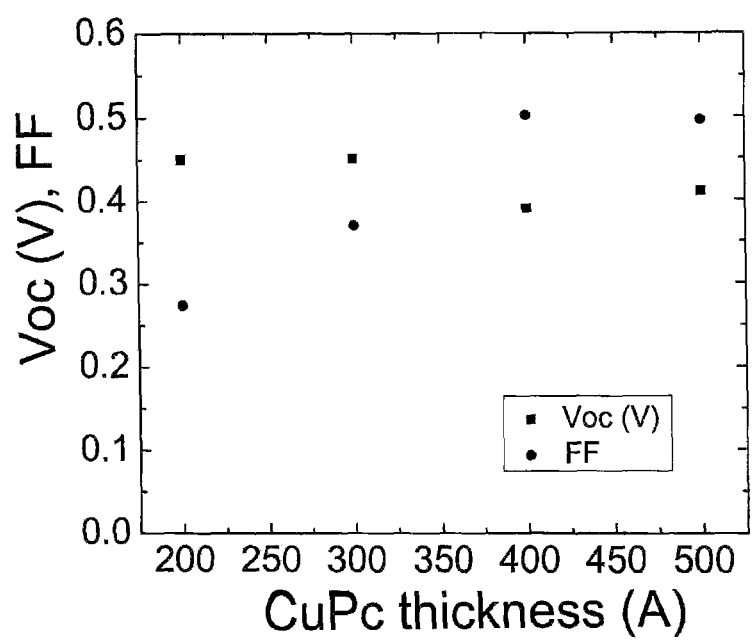
FIG. 3b is a plot of CuPc versus $V_{OC}$ and FF.
Figure 3C:
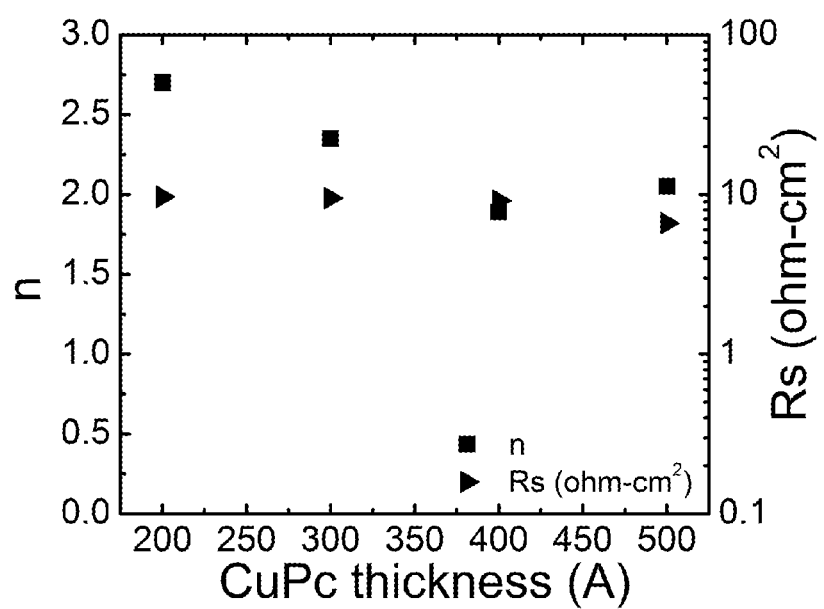
Figure 3D:
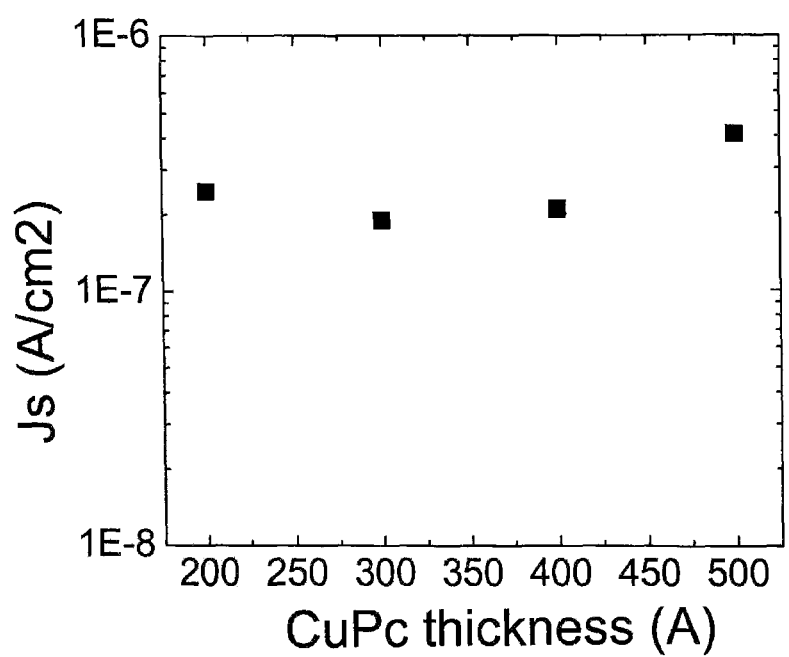
FIG. 3d is a plot of CuPc thickness versus $J_S$.

Inverted organic photosensitive optoelectronic devices are described herein. The organic devices described may be used, for example, to generate a usable electrical current from incident electromagnetic radiation (e.g., PV devices) or may be used to detect incident electromagnetic radiation. Some embodiments may comprise an anode, a cathode, and a photoactive region between the anode and the cathode. The photoactive region is the portion of the photosensitive device that absorbs electromagnetic radiation to generate excitons that may dissociate in order to generate an electrical current. The devices described herein may also include at least one transparent electrode to allow incident radiation to be absorbed within the device. Several PV device materials and configurations are described in U.S. Pat. Nos. 6,657, 378, 6,580,027, and 6,352,777, which are incorporated herein by reference for their disclosure of PV device materials and configurations.

As used herein, the term "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by for its disclosure of electrodes, provides examples of electrodes, or contacts, which may be used in a photosensitive optoelectronic device. In a photosensitive optoelectronic device, it may be desirable to allow the maximum amount of ambient electromagnetic radiation from the device exterior to be admitted to the photoconductively active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be substantially transparent. The opposing electrode may be a reflective material so that light which has passed through the cell without being absorbed is reflected back through the cell. As used herein, a layer of material or a sequence of several layers of different materials is said to be "transparent" when the layer or layers permit at least about 50% of the ambient electromagnetic radiation in relevant wavelengths to be transmitted through the layer or layers. Similarly, layers which permit some, but less than about 50% transmission of ambient electromagnetic radiation in relevant wavelengths are said to be "semi-transparent."

The term "cathode" is used in the following manner. In a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

As used herein, "top" means furthest away from the substrate structure (if present), while "bottom" means closest to the substrate structure. If the device does not include a substrate structure, then "top" means furthest away from the reflective electrode. For example, for a device having two electrodes, the bottom electrode is the electrode closest to the substrate structure, and is generally the first electrode fabricated. The bottom electrode has two surfaces, a bottom side closest to the substrate, and a top side further away from the substrate. Where a first layer is described as "disposed over" or "on top of" a second layer, the first layer is disposed further away from substrate. There may be other layers between the first and second layer, unless it is specified that the first layer is "in physical contact with" the second layer. For example, a cathode may be described as "disposed over" or "on top of" an anode, even though there are various organic layers in between.

FIG. 1 shows inverted organic photosensitive optoelectronic device 100. The figures are not necessarily drawn to scale. Device 100 may include reflective substrate 110, donor layer 115, acceptor layer 120, optional blocking layer 125, and transparent electrode 130. Device 100 may be fabricated by depositing the layers described, in order. In some embodiments, the device described in FIG. 1 may optionally include a very thin, damage inducing metal layer between blocking layer 125 and transparent electrode 130 such that transparency is not impacted. Device 100 may also optionally include substrate structure 135. In some embodiments, the substrate structure may directly support reflective electrode 110.

The specific arrangement of layers illustrated in FIG. 1 is exemplary only, and is not intended to be limiting. For example, some of the layers (such as blocking layers) may be omitted. Other layers (such as reflective electrode or additional acceptor and donor layers) may be added. The order of layers may be altered. Arrangements other than those specifically described may be used. Additionally, the organic PV device may exist as a tandem device comprising one or more additional donor-acceptor layers. A tandem device may have charge transfer layers, electrodes, or charge recombination layers between the tandem donor-acceptor layers. The substrate and reflective electrode may be combined, the substrate may be reflective and the electrode transparent.

Substrate 135, onto which the device may be grown or placed, may be any suitable material that provides the desired structural properties. The substrate may be flexible or rigid, planar or non-planar. The substrate may be transparent, translucent or opaque. Plastic, glass, and quartz are examples of rigid substrate materials. Plastic and metal foils are examples of flexible substrate materials. The material and thickness of the substrate may be chosen to obtain the desired structural and optical properties.

In some embodiments, reflective electrode 110 may comprise an electrode, such as a metal anode. In some embodiments, reflective electrode 110 may comprise a low work function metal selected from steel, Ni, Ag, Al, Mg, In, and mixtures or alloys thereof. In some embodiments, the electrode may comprise one metal as the base and one as the electrode material, such as Ti, stainless steel, or Al sheets, with or without Ag on top.

In some embodiments, reflective electrode 110 and substrate material 135 may be combined or formed of two metals. In some embodiments substrate 135 is reflective and electrode 110 is transparent.

In some embodiments, the "electrodes" described herein may be composed of "metal" or "metal substitutes." Herein, the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV, rendering it transparent to wavelengths greater than approximately 3900 Å. Another suitable metal substitute is the transparent conductive polymer polyaniline (PANT) and its chemical relatives.

Metal substitutes may be further selected from a wide range of non-metallic materials, wherein the term "non-metallic" is meant to embrace a wide range of materials, provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes described herein may sometimes be referred to as "metal-free," wherein the term "metal-free" is expressly meant to embrace a material free of metal in its chemically uncombined form. Free metals typically have a form of metallic bonding that results from a sea of valence electrons which are free to move in an electronic conduction band throughout the metal lattice. While metal substitutes may contain metal constituents, they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

Transparent electrode 130 may be chosen from transparent oxides and metal or metal substitutes having a thickness sufficient to render them transparent. Commonly used metal substitutes for electrodes and charge transfer layers would include doped wide-bandgap semiconductors, for example, transparent conducting oxides. In some embodiments, transparent electrode 130 may be selected from ITO, GITO, and ZITO. Other exemplary electrodes include highly transparent, non-metallic, low resistance cathodes such as those disclosed in U.S. Pat. No. 6,420,031, to Parthasarathy et al., or a highly efficient, low resistance metallic/non-metallic compound cathode such as those disclosed in U.S. Pat. No. 5,703,436 to Forrest et al., both incorporated herein by reference for their disclosure of cathodes. Each type of cathode is typically prepared in a fabrication process that includes the step of sputter depositing an ITO layer onto either an organic material, such as CuPc, to form a highly transparent, non-metallic, low resistance cathode or onto a thin Mg:Ag layer to form a highly efficient, low resistance metallic/non-metallic compound cathode.

The devices described herein will comprise at least one "photoactive region" in which light is absorbed to form an excited state, or "exciton", which may subsequently dissociate in to an electron and a hole. The dissociation of the exciton will typically occur at the "heterojunction" formed by the juxtaposition of an donor layer and an acceptor layer. For example, in the device of FIG. 1, the "photoactive region" may include donor layer 115 and acceptor layer 120. Charge separation may occur predominantly at the organic heterojunction between donor layer 115 and acceptor layer 120. The built-in potential at the heterojunction is determined by the HOMO-LUMO energy level difference between the two materials contacting to form the heterojunction. The HOMO-LUMO gap offset between the donor and acceptor materials produces an electric field at the donor-acceptor interface that facilitates dissociation of excitons created within an exciton diffusion length of the interface into opposite signed carriers (holes and electrons).

Suitable materials comprising acceptor layer 120 may include, for example, polymeric or non-polymeric perylenes, naphthalenes, fullerenes or nanotubules. In some embodiments, acceptor layer 120 may comprise 3,4,9,10-perylenetetracarboxylic bis-benzimidazole (PTCBI). In other embodiments, acceptor layer 120 may comprise a fullerene material as described in U.S. Pat. No. 6,580,027, the description of fullerene material which is incorporated herein by reference in its entirety. In some embodiments, donor layer 115 may comprise squaraines, phthalocyanine, porphyrin, subphthalocyanine (SubPc), copper phthalocyanine (CuPc), or a derivative or transition metal complex thereof such as aluminum phthalocyanine chloride (AlClPc).

Other suitable organic materials for use in the photoactive layers may include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic may refer to compounds which have an organic group bonded to a metal through a carbon-metal bond. Organometallic compounds may comprise, in addition to one or more carbon-metal bonds to an organic species, one or more donor bonds from a heteroatom. The carbon-metal bond to an organic species may refer, for example, to a direct bond between a metal and a carbon atom of an organic group, such as phenyl, alkyl, alkenyl, etc. The term cyclometallated refers to compounds that comprise a bidentate organometallic ligand so that, upon bonding to a metal, a ring structure is formed that includes the metal as one of the ring members.

As alluded to above with respect to the term "layer," it should be understood that the boundary of acceptor layer 120 and donor layer 115, as depicted in FIG. 1, may be imperfect, discontinuous, and/or otherwise represent an interpenetrating, entangled or convoluted network of donor and acceptor materials. For example, in some embodiments, while the organic donor-acceptor heterojunction may form a planar heterojunction, in others it may form a bulk heterojunction, nanocrystalline bulk heterojunction, hybrid planar-mixed heterojunction, or mixed heterojunction. In some embodiments, two or more organic donor-acceptor heterojunctions may be used to create a tandem inverted PV device.

Organic layers may be fabricated using vacuum deposition, spin coating, organic vapor-phase deposition, inkjet printing, and other methods known in the art.

Organic photosensitive optoelectronic devices of the embodiments described herein may function as a PV device, photodetector or photoconductor. Whenever the organic photosensitive optoelectronic devices described herein function as a PV device, the materials used in the photoconductive organic layers and the thicknesses thereof may be selected, for example, to optimize the external quantum efficiency of the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

The desired result may be achieved by considering several guidelines that may be used in the selection of layer thicknesses. It may be desirable for the layer thickness, L, to be less than or on the order of an exciton diffusion length, $L_D$, since it is believed that most exciton dissociation will occur within a diffusion length of a donor-acceptor interface. In this description, L is the distance from the exciton formation site and a donor-acceptor interface. If L is greater than $L_D$, then many excitons may recombine before dissociation. It is further desirable for the total photoconductive layer thickness to be of the order of the electromagnetic radiation absorption length, $1\alpha$ (where $\alpha$ is the absorption coefficient), so that nearly all of the radiation incident on the PV device is absorbed to produce excitons. Furthermore, the photoconductive layer thickness should be as thin as possible to avoid excess series resistance due to the high bulk resistivity of organic semiconductors.

Accordingly, such competing guidelines inherently may require tradeoffs to be made in selecting the thickness of the photoconductive organic layers of a photosensitive optoelectronic cell. Thus, on the one hand, a thickness that is comparable or larger than the absorption length may be desirable in order to absorb the maximum amount of incident radiation. On the other hand, as the photoconductive layer thickness increases, two undesirable effects may be increased. One may be due to the high series resistance of organic semiconductors, as an increased organic layer thickness may increase device resistance and reduce efficiency. Another undesirable effect is that increasing the photoconductive layer thickness may increase the likelihood that excitons will be generated far from the charge-separating interface, resulting in enhanced probability of geminate recombination and, again, reduced efficiency. Therefore, it may be desirable to have a device configuration that balances between such competing effects, in a manner that produces a high external quantum efficiency for the overall device.

The device of FIG. 1 may further include one or more of blocking layer 125, such as the exciton blocking layers (EBLs) described in U.S. Pat. No. 6,097,147, Peumans et al., *Applied Physics Letters* 2000, 76, 2650-52, and U.S. Pat. No. 6,451,415, Forrest et al., all of which are incorporated herein by reference for their disclosure of blocking layers. In certain embodiments, higher internal and external quantum efficiencies have been achieved by the inclusion of an EBL to confine photogenerated excitons to the region near the dissociating interface and to prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an organic PV device non-functional. An EBL can therefore help protect fragile organic layers from damage produced when electrodes are deposited onto the organic materials.

Without being bound to any particular theory, it is believed that the EBLs derive their exciton blocking property from having a LUMO-HOMO energy gap substantially larger than that of the adjacent organic semiconductor from which excitons are being blocked. Thus, the confined excitons are prohibited from existing in the EBL due to energy considerations. While it is desirable for the EBL to block excitons, it is not desirable for the EBL to block all charge. However, due to the nature of the adjacent energy levels, an EBL may block one sign of charge carrier. By design, an EBL will exist between two other layers, usually an organic photosensitive semiconductor layer and an electrode, a charge transfer layer or a charge recombination layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. In certain embodiments, it may be desirable for a material used as a cathode side EBL to have a LUMO energy level closely matching the LUMO energy level of the adjacent acceptor material so that any undesired barrier to electrons is minimized.

It should be appreciated that the exciton blocking nature of a material is not necessarily an intrinsic property of its HOMO-LUMO energy gap. Whether a given material will act as an exciton blocker depends upon the relative HOMO and LUMO energy levels of the adjacent organic photosensitive material. Therefore, it may not be possible to identify a class of compounds in isolation as exciton blockers without regard to the device context in which they may be used. However, with the teachings herein, one of ordinary skill in the art may identify whether a given material will function as an exciton blocking layer when used with a selected set of materials to construct an organic PV device.

In some embodiments, blocking layer 125 may comprise an EBL situated between acceptor layer 120 and transparent electrode 130. Examples of suitable EBL materials include, but are not limited to, 2,9-dimethyl-4,7-diphenyl-1,10-phenanthroline (also called bathocuproin or BCP), which is believed to have a LUMO-HOMO energy level separation of about 3.5 eV, or bis(2-methyl-8-hydroxyquinolinoato)-aluminum(III)phenolate (Alq$_2$OPH). BCP may be an effective exciton blocker which can easily transport electrons to the cathode from an acceptor layer. In other embodiments, the EBL may be selected from N,N'-diphenyl-N,N'-bis-alpha-naphthylbenzidine (NPD), aluminum tris (8-hydroxyquinoline) (Alq3), carbazole biphenyl (CBP), and tris(acetylacetonato) ruthenium (III) (Ru(acac)$_3$).

In some embodiments, blocking layer 125 may comprise an EBL doped with a suitable dopant, including but not limited to 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), and derivatives thereof. BCP, as deposited in the devices described herein, may be amorphous. Amorphous BCP exciton blocking layers may exhibit film recrystallization, which may be especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a given device with a material having a LUMO energy level close to that of the EBL may help to insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

In some embodiments, the device of FIG. 1 may further comprise one or more transparent charge transfer layers or charge recombination layers. As described herein, charge transfer layers are distinguished from acceptor and donor layers by the fact that charge transfer layers are frequently, but not necessarily, inorganic (often metals) and they may be chosen not to be photoconductively active. The term "charge transfer layer" is used herein to refer to layers similar to but different from electrodes in that a charge transfer layer only delivers charge carriers from one subsection of an optoelectronic device to the adjacent subsection. The term "charge recombination layer" is used herein to refer to layers similar to but different from electrodes in that a charge recombination layer allows for the recombination of electrons and holes between tandem photosensitive devices and may also enhance internal optical field strength near one or more active layers. A charge recombination layer can be constructed of semi-transparent metal nanoclusters, nanoparticles or nanorods as described in U.S. Pat. No. 6,657,378, the disclosure of which is incorporated herein by reference.

In other embodiments, a smoothing layer may be situated between reflective electrode 110 (e.g., anode) and donor layer 115. A exemplary material for this layer comprises a film of 3,4-polyethylenedioxythiophene:polystyrenesulfonate (PEDOT:PSS). The introduction of the PEDOT:PSS layer between reflective electrode 110 (e.g., anode comprising ITO) and donor layer 115 (e.g., CuPc) may lead to greatly improved fabrication yields. Without being bound to a particular theory, it is believed that the improved fabrication yields may be a result of the ability of the spin-coated PEDOT:PSS film to planarize the ITO, whose rough surface could otherwise result in shorts through the thin molecular layers.

In a further embodiment, one or more of the layers of the FIG. 1 device may undergo surface treatments. For example, one or more of the layers may be treated with plasma prior to depositing the next layer. The layers may be treated, for example, with a mild argon or oxygen plasma. This treatment may be beneficial in reducing the series resistance. It may be advantageous to subject an optional PEDOT:PSS layer to a mild plasma treatment prior to deposition of the next layer. Alternatively, one or more of the layers may be exposed to ultra-violet ozone (UV-$O_3$) treatment. In at least one embodiment, the reflective electrode (e.g., anode layer) is exposed to a surface treatment.

The embodiments described herein also include a method for producing the organic PV device of FIG. 1, comprising: providing reflective electrode 110, performing at least one surface treatment on reflective electrode 110, forming an organic donor-acceptor heterojunction (e.g., donor layer 115 and acceptor layer 120) over reflective electrode 110, and forming transparent electrode 130 over said organic donor-acceptor heterojunction.

The embodiments described herein also include methods for generating and/or measuring electricity. In some embodiments, that method comprises: providing light to the device of FIG. 1, which comprises reflective electrode 110, organic donor-acceptor heterojunction on top of said reflective electrode (e.g., donor layer 115 and acceptor layer 120), and transparent electrode 130 on top of said donor-acceptor heterojunction.

In some embodiments, a power-generating device is described, which may include at least one device of FIG. 1, comprising: a reflective electrode 110; organic donor-acceptor heterojunction on top of said reflective electrode (e.g., donor layer 115 and acceptor layer 120); and transparent electrode 130 on top of said donor-acceptor heterojunction. In some embodiments, the device may be in the form of a paint, film, or foil. For example, in one embodiment, device 100 can be formed on substrate structure 135, which comprises a film, foil, or the like, or formed directly on the enclosure of a device, such as applying paint. In some embodiments, the device displays a $\eta_p$ in a range from about 0.3 to about 0.4. In some embodiments, the device displays a $V_{oc}$ in a range from about 0.2 to about 1.5, such as about 0.4 to about 0.5. In some embodiments, the device displays a FF in the range of about 0.4 to about 0.85, such as about 0.5. In some embodiments, the device displays $J_{sc}/P_0$ in the range of about 0.002 to about 0.025 A/W, such as 0.02. In some embodiments, the device displays a $R_{SA}$ in a range from about 5 to about 12. In some embodiments, the device displays a $J_S$ in a range from about $2 \times 10^{-7}$ to about $7 \times 10^{-7}$. In some embodiments, the device displays an $\eta$ of less than about 2, such as approaching about 1.

In further embodiments, the organic photosensitive optoelectronic devices described herein may function as photodetectors. In this embodiment, device 100 may be a multilayer organic device, for example, as described in U.S. Pat. No. 6,972,431, the disclosure of which is incorporated herein by reference. In this case, an external electric field may be generally applied to facilitate extraction of the separated charges.

Coatings may be used to focus optical energy into desired regions of device 100. See, e.g., U.S. Pat. No. 7,196,835; U.S. patent application Ser. No. 10/915,410, which is incorporated by reference to provide examples of such a coating.

The simple layered structure illustrated in FIG. 1 is provided by way of non-limiting example, and it is understood that embodiments described herein may be used in connection with a wide variety of other structures. The specific materials and structures described are exemplary in nature, and other materials and structures may be used. Functional organic photosensitive optoelectronic devices may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

The devices described herein will be further described by the following non-limiting examples, which are intended to be purely exemplary.

EXAMPLES

Example 1

Inverted structures were demonstrated using the archetype donor-acceptor bilayer system formed by CuPc and PTCBI. Optical simulations were employed to predict device performance and optimize the inverted structures. Standard transfer-matrix calculations were performed to predict the $J_{SC}$. See, e.g., *Appl. Phys. Rev.* 93, 3693 (2003) and *J. Appl. Phys.* 86, 487 (1999), which are incorporated herein by reference for the disclosure of transfer-matrix calculations. Results of the thickness studies are shown in FIGS. 2 and 3.

Example 2

Figure 4A:
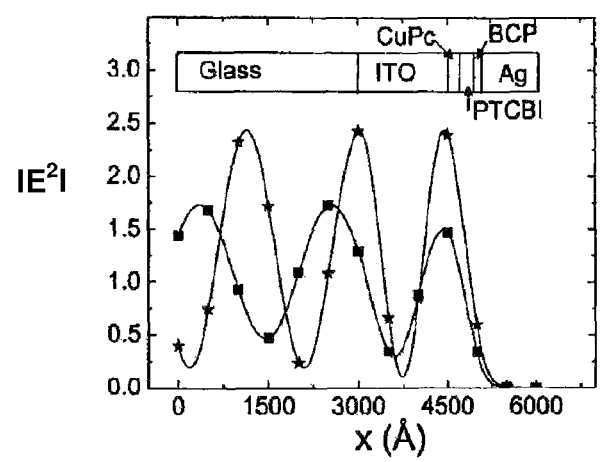
FIG. 4a shows calculations from a standard transfer-matrix simulation performed on a control PV device grown on glass: ITO (1550 Å)/CuPc (200 Å)/PTCBI (250 Å)/BCP (100 Å)/Ag (1000 Å). The optical fields at peak absorption of CuPc at 625 nm (squares) and of PTCBI at 540 nm (stars) are shown.
Figure 4B:
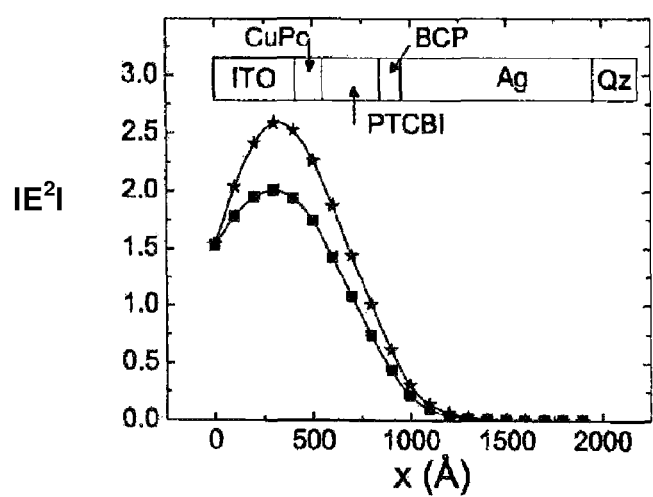
FIG. 4b shows calculations from a standard transfer-matrix simulation performed on an inverted PV device consistent with the embodiments described herein: quartz/Ag (1000 Å)/BCP (100 Å)/PTCBI (300 Å)/CuPc (150 Å)/ITO (400 Å). The optical fields at peak absorption of CuPc at 625 nm (squares) and of PTCBI at 540 nm (stars) are shown.
Figure 4C:
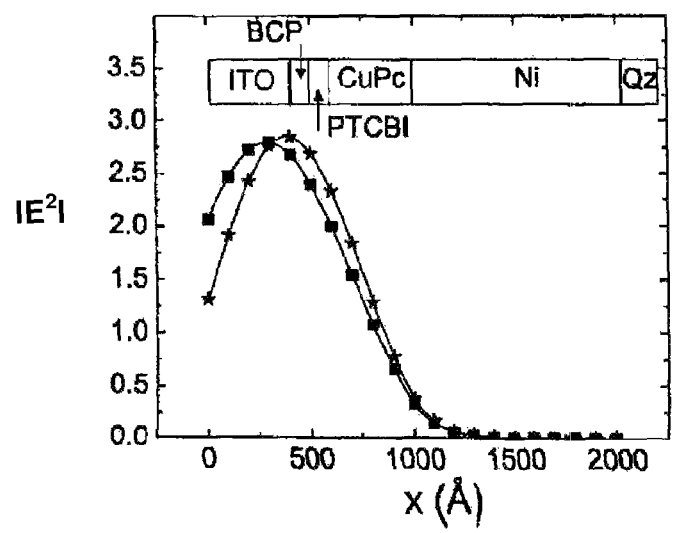
FIG. 4c shows calculations from a standard transfer-matrix simulation performed on an inverted PV device consistent with the embodiments described herein: quartz/Ni (1000 Å)/CuPc (400 Å)/PTCBI (100 Å)/BCP (100 Å)/ITO (400 Å). The optical fields at peak absorption of CuPc at 625 nm (squares) and of PTCBI at 540 nm (stars) are shown.

Optical constants of organic films grown on Si substrates were measured using ellipsometry, while those of Ni were taken from the literature. See, e.g., *J. Phys. F: Metal Phys.* 9, 2491 (1979), which is incorporated herein by reference for this purpose. Exciton diffusion lengths of CuPc and PTCBI were taken to be 80 Å and 40 Å, respectively, with lifetimes of 2 ns. See, e.g., *Appl. Phys. Rev.* 93, 3693 (2003), which is incorporated herein by reference for this purpose. In the simulations, three structures were investigated: one control PV and two inverted PVs. The control PV device was glass/ITO (1550 Å)/CuPc (200 Å)/PTCBI (250 Å)/BCP (100 Å)/Ag (1000 Å). Results for this control PV can be seen in FIG. 4*a*. The first inverted PV device was quartz/Ag (1000 Å)/BCP (100 Å)/PTCBI (300 Å)/CuPc (150 Å)/ITO (400 Å). Results for this control PV can be seen in FIG. 4*b*. The second inverted PV device was quartz/Ni (1000 Å)/CuPc (400 Å)/PTCBI (100 Å)/BCP (100 Å)/ITO (400 Å). Results for this control PV can be seen in FIG. 4*c*.

Example 3

Three different types of the second inverted PV device (quartz/Ni (1000 Å)/CuPc (400 Å)/PTCBI (100 Å)/BCP (100 Å)/ITO (400 Å)) were formed by preparing a quartz substrate by solvent cleaning. See, e.g., *Organic Electron* 6, 242 (2005), which is incorporated herein by references for this purpose. The quartz base structures were loaded into an electron beam evaporator where 1000 Å Ni were deposited at a rate of 10 Å/s. See, e.g., *Appl. Phys. Lett.* 86, 263502 (2005), which is incorporated herein by references for this purpose. The Ni anodes were exposed to three different surface treatments. The first was exposed to 30 minutes of ultra-violet ozone (UV-$O_3$) treatment. The second was exposed to $O_2$ plasma at a power of 120 W for 80 s. The third was exposed to Ar plasma at a power of 70 W for 2 minutes, followed by 30 minutes of UV-$O_3$ treatment. The structures were then loaded in a high vacuum thermal deposition chamber having base pressure of $5\times10^{-7}$ Torr. Purified organic sources were grown at a pressure of $1\times10^{-6}$ Torr and a rate of 2 Å/s. See, e.g., *Organic Electron* 6, 242 (2005), which is incorporated herein by reference for this purpose. The planar double heterojunction solar cell PV structure grown consisted of a 400 Å thick CuPc donor layer, a 100 Å thick PTCBI acceptor layer, and a 1000 Å thick BCP exciton blocking (see, e.g., *Appl. Phys. Lett.* 76, 2650 (2000), which is incorporated herein by reference for this purpose) and damage absorbing layer. A vacuum break and exposure to air was necessary before attaching a shadow mask in a nitrogen ambient atmosphere. The top contact was formed by a 400 Å thick ITO cathode layer sputter-deposited at 15 W and 13.56 MHz through the shadow mask defining 1 mm diameter holes.

Figure 5A:
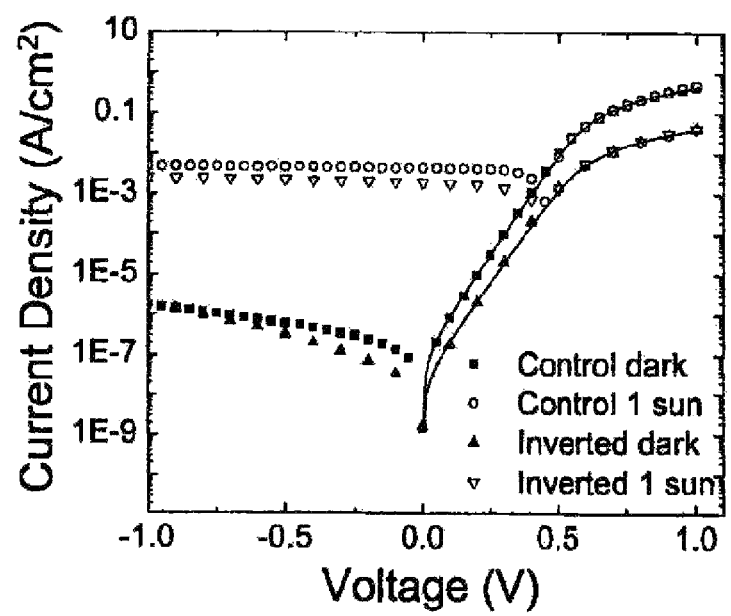
FIG. 5a shows current-voltage curves for a control PV device grown on glass: ITO (1550 Å)/CuPc (200 Å)/PTCBI (250 Å)/BCP (100 Å)/Ag (1000 Å) in the dark (filled squares) and under simulated 1-sun illumination (open circles).
Figure 5B:
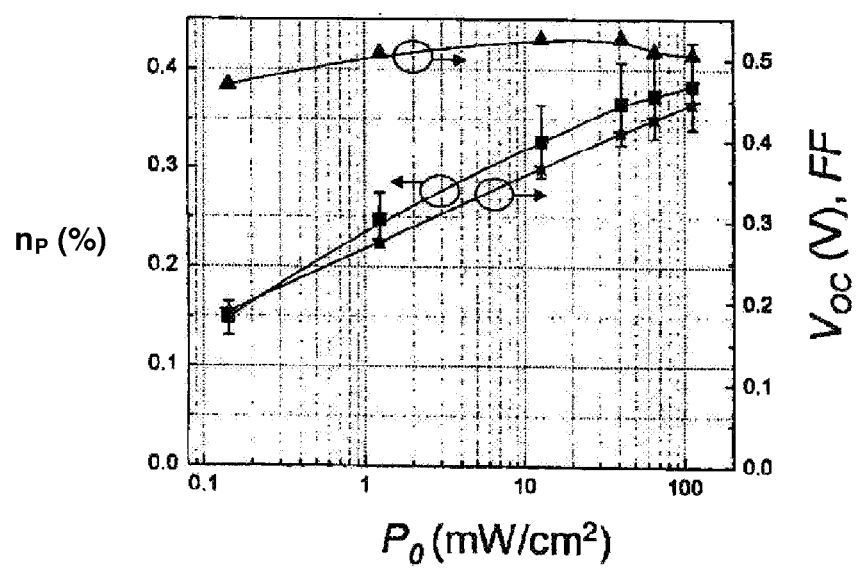
FIG. 5b shows $\eta_P$ (squares), $V_{OC}$ (stars) and FF (triangles) as a function of incident power density for an inverted PV device consistent with the embodiments described herein: quartz/Ni (1000 Å)/CuPc (400 Å)/PTCBI (100 Å)/BCP (100 Å)/ITO (400 Å) treated with Ar plasma.

Current-voltage measurements were used to characterize the performance of the cells in the dark and under simulated AM1.5G solar illumination (uncorrected for solar spectral mismatch) using a 150 W Xenon arc lamp. Performance data for the Ar plasma treated device is shown in FIG. 5. The dark current (filled triangles) and 1 sun illumination (open triangles) current-voltage curves are shown in FIG. 5*a*, along with the fit to the dark current (line). Performance for this cell as a function of illumination intensity is shown in FIG. 5*b*.

The control PV was grown under similar conditions, in the same chamber and using the same organic materials, on solvent-cleaned, 10 minute UV-$O_3$ treated ITO-coated glass, comprising: ITO (1550 Å)/CuPc (200 Å)/PTCBI (250 Å)/BCP (100 Å)/Ag (1000 Å). Under AM1.5G 1 sun solar illumination, the control device displayed a $V_{OC}$ of 0.44 V, a FF of 0.64, a $J_{SC}/P_0$ of 0.44 /W, leading to a $\eta_P$ of 1.2±0.1%. The dark current-voltage current curve was fit to the modified ideal diode equation:

$$J_D = J_S\left\{\exp\left[\frac{q(V - J_D R_{SA})}{nkT}\right] - 1\right\}$$

giving n of 1.66, $R_{SA}$ of 0.75 $\Omega$-cm$^2$, and $J_S$ of $9.8\times10^{-8}$ /cm$^2$. FIG. 5*a* shows the device current in the dark (filled squares) and under 1 sun illumination (open circles). The line represents the fit to the dark current.

Table 1 (below) lists dark curve fit parameters and AM1.5G 1 sun performance data for devices grown on substrates exposed to the three different surface treatments discussed above.

TABLE 1

| Surface Treatment | 1 sun $\eta_P$ (%) | 1 sun $V_{OC}$ (V) | 1 sun FF | 1 sun $J_S/P_O$ (A/W) | $R_{SA}$ ($\Omega$-cm$^2$) | $J_S$ (A/cm$^2$) | n |
|---|---|---|---|---|---|---|---|
| UV-$O_3$ | 0.31 ± 0.06 | 0.39 ± 0.03 | 0.50 ± 0.05 | 0.016 ± 0.001 | 9.1 ± 4.6 | 2.1 × 10$^{-7}$ ± 0.9 × 10$^{-7}$ | 1.88 ± 0.08 |
| $O_2$ plasma | 0.31 ± 0.02 | 0.37 ± 0.01 | 0.51 ± 0.01 | 0.016 ± 0.002 | 4.9 ± 1.0 | 7.0 × 10$^{-7}$ ± 0.5 × 10$^{-7}$ | 2.00 ± 0.10 |
| Ar plasma | 0.35 ± 0.04 | 0.45 ± 0.01 | 0.48 ± 0.03 | 0.017 ± 0.001 | 11.6 ± 3.7 | 2.7 × 10$^{-8}$ ± 0.2 × 10$^{-8}$ | 1.83 ± 0.10 |

Example 4

Inverted PV devices having CuPc and PTCBI layers of varying thickness were prepared as follows. Quartz substrates were solvent cleaned, then loaded into an electron beam evaporator where a 1000 Å thick layer of Ni was deposited at a rate of 5 Å/s. The Ni anodes were exposed to ultraviolet ozone treatment for 30 min, then loaded into a high vacuum thermal deposition chamber with a base pressure of $5\times10^{-7}$ Torr. Purified organic sources were grown at a pressure of $1\times10^{-6}$ Torr, and a rate of 2 Å/s. A vacuum break occurred before attaching a shadow mask to the deposited layers and substrate in a high purity (<1 ppm $H_2O$ and $O_2$) $N_2$ ambient. The top contact consisted of a 400 Å thick ITO layer sputter deposited at 20 W with a rate of 0.1 Å/s through the shadow mask defining an array of 1 mm diameter circular cathodes. Performance data for the devices prepared by this method are disclosed below.

Figure 6A:
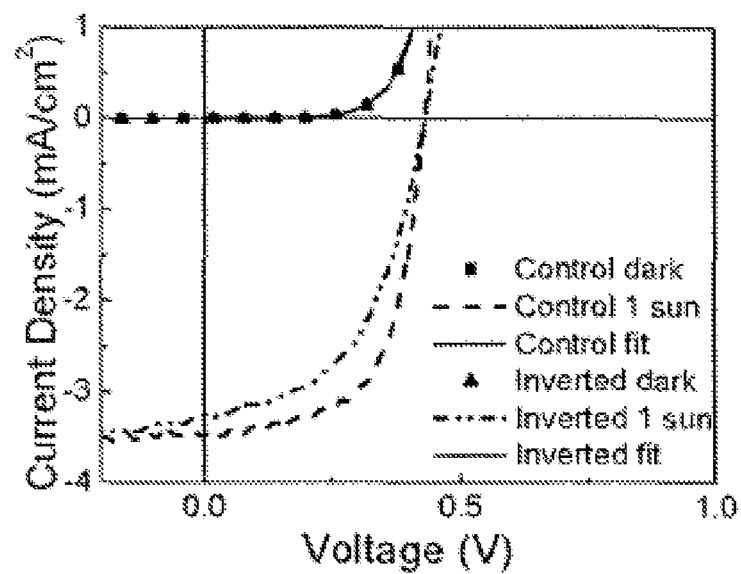
FIG. 6a shows the current-voltage characteristics for a control device (glass/ITO (1550 Å)/CuPc (200 Å)/PTCBI (250 Å)/BCP (100 Å)/Ag (1000 Å)) in the dark (squares) and under simulated 1 sun, AM1.5G illumination (dashed lines), and for inverted PV device consistent with the embodiments described herein: quartz/Ni (1000 Å)/CuPc (350 Å)/PTCBI (100 Å)/BCP (100 Å)/ITO (400 Å) in the dark (triangles) and under illumination (dashed-dotted line).
Figure 6B:
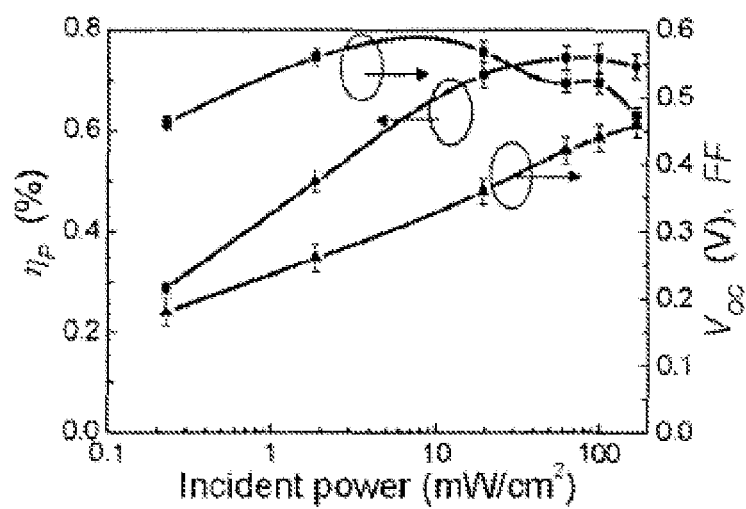
FIG. 6b shows the $\eta_P$ (circles), $V_{OC}$ (triangles), and FF (squares) for an inverted PV device comprising quartz/Ni (1000 Å)/CuPc (350 Å)/PTCBI (100 Å)/BCP (100 Å)/ITO (400 Å).

The performance of an inverted PV device comprising quartz/Ni (1000 Å)/CuPc (350 Å)/PTCBI (100 Å)/BCP (100 Å)/ITO (400 Å) is disclosed in FIG. 6. FIG. 6a shows the current-voltage characteristics for a control device (glass/ITO (1550 Å)/CuPc (200 Å)/PTCBI (250 Å)/BCP (100 Å)/Ag (1000 Å)) in the dark (squares) and under simulated 1 sun, AM1.5G illumination (dashed lines), and for the inverted device in the dark (triangles) and under illumination (dashed-dotted line). FIG. 6b shows the power conversion efficiency (circles), open-circuit voltage (triangles), and fill factor (squares) for the inverted device.

Figure 7A:
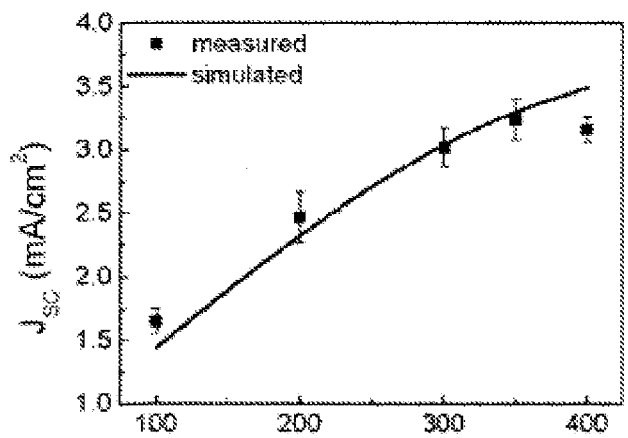
FIG. 7a shows the simulated (line) and measured (filled squares) photocurrent at one sun intensity of inverted PV devices having varying CuPc thicknesses (x=100 to 400 Å) in a structure comprising quartz/Ni (1000 Å)/CuPc (x Å)/PTCBI (100 Å)/BCP (100 Å)/ITO (400 Å).
Figure 7B:
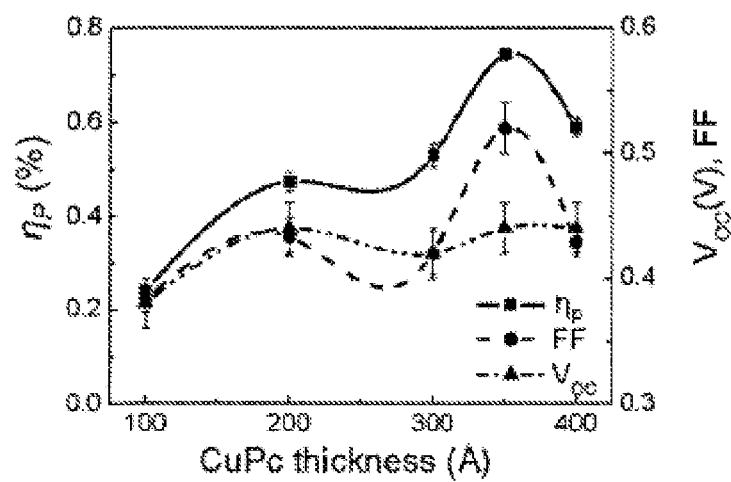
FIG. 7b shows $\eta_P$ (squares), $V_{OC}$ (triangles), and FF at one sun AM1.5G illumination of inverted PV devices having varying CuPc thicknesses (x=100 to 400 Å) in a structure comprising quartz/Ni (1000 Å)/CuPc (x Å)/PTCBI (100 Å)/BCP (100 Å)/ITO (400 Å).
Figure 8A:
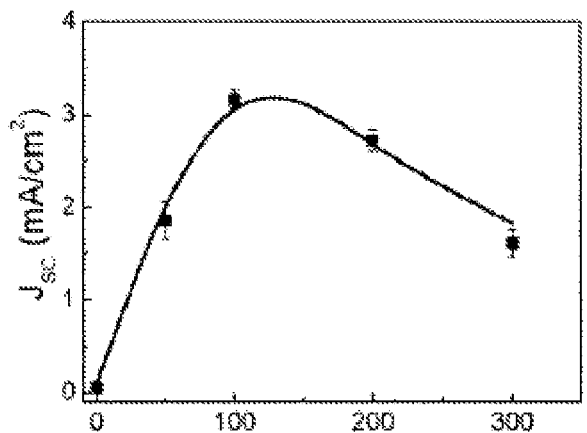
FIG. 8a shows the simulated (line) and measured (filled squares) photocurrent at one sun intensity of inverted PV devices having varying PTCBI thicknesses (y=0 to 300 Å) in a structure comprising quartz/Ni (1000 Å)/CuPc (400 Å)/PTCBI (y Å)/BCP (100 Å)/ITO (400 Å).
Figure 8B:
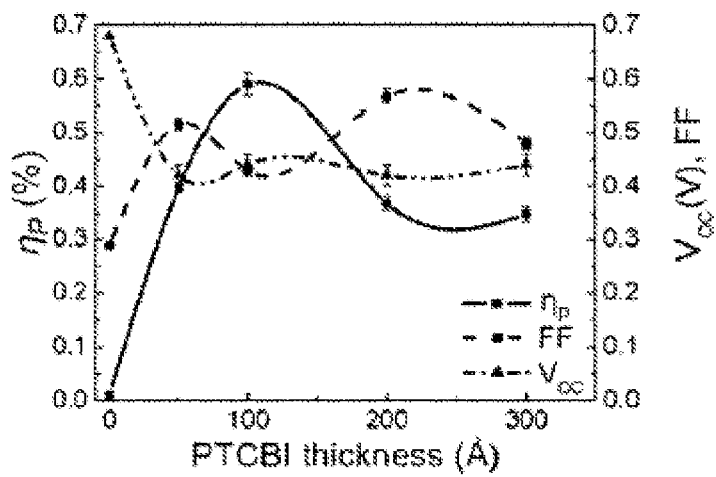
FIG. 8b shows $\eta_P$ (squares), $V_{OC}$ (triangles), and FF at one sun AM1.5G illumination of inverted PV devices having varying PTCBI thicknesses (y=0 to 300 Å) in a structure comprising quartz/Ni (1000 Å)/CuPc (400 Å)/PTCBI (y Å)/BCP (100 Å)/ITO (400 Å).

FIGS. 7 and 8 show the performance of inverted devices having CuPc layers (x=100 to 400 Å) and PTCBI layers (y=0 to 300 Å) of varying thickness. The structures of FIG. 7 comprise quartz/Ni (1000 Å)/CuPc (x Å)/PTCBI (100 Å)/BCP (100 Å)/ITO (400 Å). FIG. 7a shows the simulated (line) and measured (filled squares) photocurrent of such devices at one sun intensity. FIG. 7b shows $\eta_P$ (squares), Voc (triangles), and FF at one sun AM1.5G illumination. The structures of FIG. 8 comprise quartz/Ni(1000 Å)/CuPc (400 Å)/PTCBI (y Å)/BCP (100 Å)/ITO (400 Å). FIG. 8a shows the simulated (line) and measured (filled squares) photocurrent of such devices at one sun intensity. FIG. 8b shows $\eta_P$ (squares), Voc (triangles), and FF at one sun AM1.5G illumination.

Figure 9A:
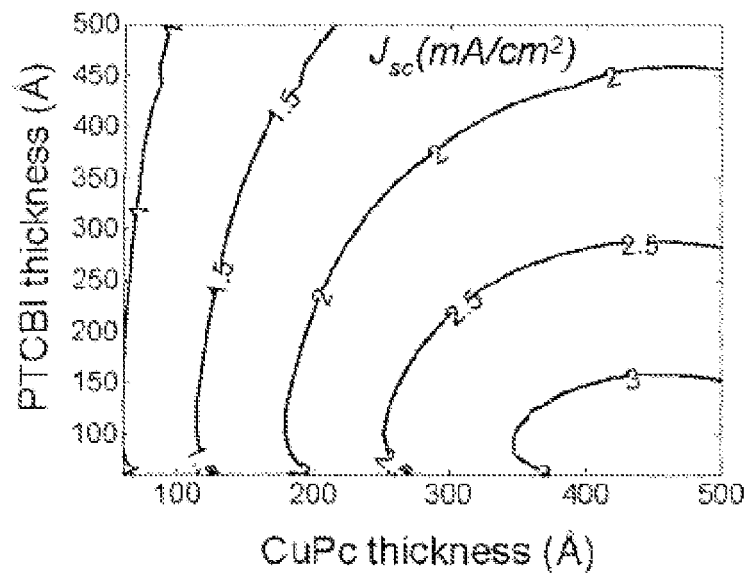
FIG. 9a shows a simulated contour plot for $J_{SC}$ as a function of CuPc and PTCBI thicknesses.
Figure 9B:
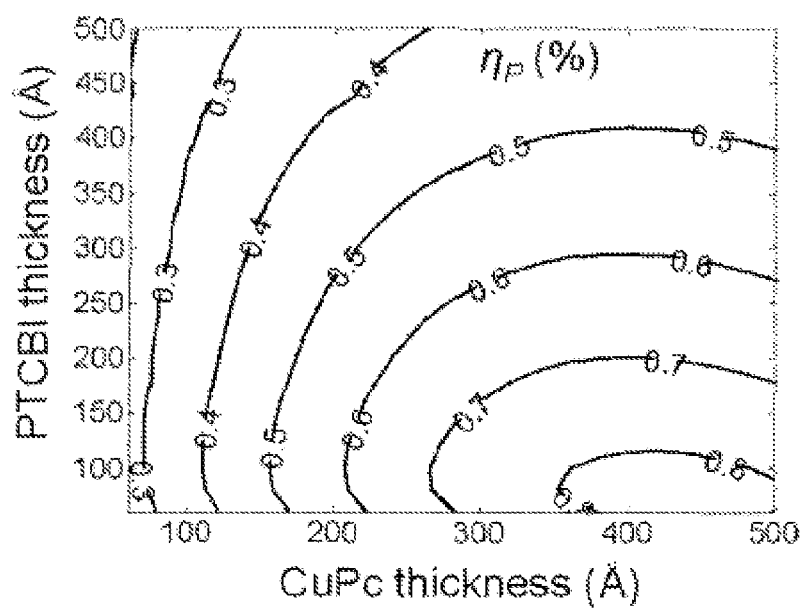
FIG. 9b shows a simulated contour plot for $\eta_P$ as a function of CuPc and PTCBI thicknesses.

FIG. 9 shows a simulated contour plot for a devices having varying CuPc and PTCBI thicknesses. FIG. 9a shows a simulated contour plot for $J_{SC}$, while FIG. 9b shows a simulated contour plot for $\eta_P$. For FIG. 9, it is assumed the ideality factor n=1.78, reverse saturation current $J_S$=1.46× $10^{-7}$ Å/cm$^2$, and the series resistance as a function of the CuPc and PTCBI thicknesses ($t_{CuPc}$ and $t_{PTCBI}$) follows $R_{SA}$=0.05×[($t_{CuPc}$+$t_{PTCBI}$)/Å]Ωcm$^2$. The diffusion lengths of CuPc and PTCBI were taken as 80±20 and 30±5 Å, with a lifetime of 2 ns. Values of Ni anode, ITO cathode, and BCP layers thicknesses were 1000, 400, and 100 Å, respectively, for these simulations.

Although the present disclosure is described with respect to particular examples and embodiments, it is understood that the devices described herein are not limited to these examples and embodiments. The embodiments as claimed may therefore include variations from the particular examples and preferred embodiments described herein, as will be apparent to one of skill in the art.

What is claimed:

1. A method for producing an inverted, organic photovoltaic device, said method comprising:
   providing a metal reflective electrode;
   performing at least an ultra-violet ozone (UV-O$_3$) surface treatment on said metal reflective electrode;
   forming an organic donor-acceptor heterojunction over said metal reflective electrode;
   and forming a transparent electrode over said organic donor-acceptor heterojunction.

2. The method of claim 1, wherein the reflective electrode is positioned over a substrate.

3. The method of claim 1, wherein the donor of the organic donor-acceptor heterojunction comprises a material selected from phthalocyanines, porphyrins, subphthalocyanines, and derivatives or transition metal complexes thereof.

4. The method of claim 1, wherein the donor of the donor-acceptor heterojunction comprises copper phthalocyanine.

5. The method of claim 1, wherein the acceptor of the organic donor-acceptor heterojunction comprises a material selected from polymeric or non-polymeric perylenes, naphthalenes, and fullerenes.

6. The method of claim 1, wherein the acceptor of the organic donor-acceptor heterojunction comprises 3,4,9,10-perylenetetracarboxylic bis-benzimidazole.

7. The method of claim 1, wherein the transparent electrode comprises a material selected from transparent oxides and metal or metal substitutes.

8. The photosensitive device of claim 1, wherein the transparent electrode permits at least about 50% of ambient electromagnetic radiation to be transmitted through said electrode.

9. The method of claim 1, wherein the transparent electrode comprises a material selected from tin oxide, gallium indium tin oxide, and zinc indium tin oxide.

10. The method of claim 1, further comprising the step of providing an exciton blocking layer.

11. The method of claim 10, wherein the exciton blocking layer is positioned between the reflective electrode and the transparent electrode.

12. The method of claim 10, wherein the exciton blocking layer is positioned between the acceptor of the organic donor-acceptor heterojunction and the transparent electrode.

13. The method of claim 10, wherein the exciton blocking layer comprises a material selected from N,N'-diphenyl-N,N'-bis-alpha-naphthylbenzidine, aluminum tris (8-hydroxyquinoline), carbazole biphenyl, bathocuproine, and tris (acetylacetonato) ruthenium (III).

14. The method of claim 1, wherein the organic donor-acceptor heterojunction comprises a structure selected from planar heterojunctions, bulk heterojunctions, nanocrystalline bulk heterojunctions, hybrid planar-mixed heterojunctions, and mixed heterojunctions.

15. The method of claim 1, further comprising performing a plasma treatment before performing the UV-O$_3$ surface treatment on the reflective electrode.

16. The method of claim 15, wherein the plasma surface treatment is selected from oxygen plasma treatment and argon plasma treatment.

17. The method of claim 1, wherein the metal reflective electrode is a metal anode.

18. The method of claim 1, wherein the metal reflective electrode comprises a metal chosen from nickel, silver, aluminum, magnesium, indium, and mixtures or alloys thereof.

* * * * *